United States Patent
Nystrom et al.

(10) Patent No.: US 7,453,139 B2
(45) Date of Patent: Nov. 18, 2008

(54) COMPLIANT TERMINAL MOUNTINGS WITH VENTED SPACES AND METHODS

(75) Inventors: Michael J. Nystrom, San Jose, CA (US); Belgacem Haba, Saratoga, CA (US); Giles Humpston, Aylesbury (GB)

(73) Assignee: Tessera, Inc., San Jose, CA (US)

( * ) Notice: Subject to any disclaimer, the term of this patent is extended or adjusted under 35 U.S.C. 154(b) by 249 days.

(21) Appl. No.: 11/318,815

(22) Filed: Dec. 27, 2005

(65) Prior Publication Data

US 2007/0145536 A1 Jun. 28, 2007

(51) Int. Cl.
*H01L 21/44* (2006.01)
*H01L 23/495* (2006.01)

(52) U.S. Cl. .................. 257/669; 257/178; 257/418; 257/667; 257/668; 438/598

(58) Field of Classification Search .................. None
See application file for complete search history.

(56) References Cited

U.S. PATENT DOCUMENTS

| | | | |
|---|---|---|---|
| 5,500,540 A * | 3/1996 | Jewell et al. | 257/82 |
| 5,624,268 A * | 4/1997 | Maeda et al. | 439/66 |
| 5,679,977 A | 10/1997 | Khandros et al. | |
| 6,407,459 B2 | 6/2002 | Kwon et al. | |
| 6,437,434 B1 * | 8/2002 | Sugizaki | 257/692 |
| 6,521,970 B1 | 2/2003 | Takiar et al. | |
| 6,555,908 B1 | 4/2003 | Eichelberger et al. | |
| 6,583,516 B2 * | 6/2003 | Hashimoto | 257/781 |
| 6,637,103 B2 * | 10/2003 | Moden | 29/832 |
| 6,774,317 B2 | 8/2004 | Fjelstad | |
| 6,888,256 B2 * | 5/2005 | Hedler et al. | 257/780 |
| 6,900,532 B1 | 5/2005 | Kelkar et al. | |
| 6,914,333 B2 | 7/2005 | Lo et al. | |
| 6,936,928 B2 | 8/2005 | Hedler et al. | |
| 2002/0109213 A1 * | 8/2002 | Kovac et al. | 257/668 |
| 2004/0238922 A1 * | 12/2004 | DiStefano et al. | 257/668 |
| 2005/0173805 A1 | 8/2005 | Damberg et al. | |
| 2005/0181544 A1 | 8/2005 | Haba et al. | |
| 2005/0181655 A1 | 8/2005 | Haba et al. | |

OTHER PUBLICATIONS http://www.tlmicorp.com/serv_pillar.htm.

* cited by examiner

*Primary Examiner*—Jack Chen
*Assistant Examiner*—James M Mitchell
(74) *Attorney, Agent, or Firm*—Lerner, David, Littenberg, Krumholz & Mentlik, LLP

(57) ABSTRACT

A compliant structure is provided on a semiconductor wafer. The compliant structure includes cavities. The compliant structure and the wafer seal the cavities during process steps used to form conductive elements on the compliant structure. After processing, vents are opened to connect the cavities to the exterior of the assembly. The vents may be formed by severing the wafer and compliant structure to form individual units, so that the severance planes intersect channels or other voids communicating with the cavities. Alternatively, the vents may be formed by forming holes in the compliant structure, or by opening bores extending through the wafer.

12 Claims, 6 Drawing Sheets

COMPLIANT TERMINAL MOUNTINGS WITH VENTED SPACES AND METHODS

BACKGROUND OF THE INVENTION

Semiconductor chips commonly are formed by processing a relatively large flat body of semiconductor material to form numerous regions, each including the electronic circuitry to be incorporated in a single chip, and then cutting the wafer along saw lanes to sever the wafer and thus form individual chips. Each chip typically is a flat rectangular body with generally planar front and rear surfaces and with small edges extending between the front and rear surfaces at the boundaries of these surfaces. Each chip typically has contacts exposed at the front surface which are electrically connected to the circuitry within the chip.

The individual chips commonly are provided in packages which facilitate handling of the chip and mounting of the chip to an external substrate, such as a circuit board or other printed circuit panel. Such packages commonly include a dielectric structure and electrically conductive terminals carried on the dielectric structure, the terminals being electrically connected to the contacts of the chip. In a package of the type referred to a chip scale package, the package occupies an area on the circuit panel only slightly larger than, or the same size as, the area of the chip front surface itself.

As disclosed, for example, in U.S. Pat. No. 5,679,977, the disclosure of which is hereby incorporated by reference herein, the terminals may be movable with respect to the chip. In certain embodiments, the package may incorporate a compliant layer overlying a surface of the chip and carrying the terminals. Movability of the terminals with respect to the chip can compensate for differential thermal expansion between the chip and the circuit panel during manufacture, during service, or both. Also, movability of the terminals with respect to the chip can facilitate engagement of the packaged chip with a testing device. During such engagement, the individual terminals may move in the direction towards or away from the front or rear surface of the chip, commonly referred to as the vertical or "Z" direction. Movement in this direction facilitates engagement of all of the terminals with all of the contacts on the testing device, even if the terminals are not precisely coplanar with one another.

The terminals of a chip package may be in the form of generally flat pads. Small solder balls may be deposited on these pads so that the package may be bonded to a circuit panel by aligning the solder balls with corresponding contact pads of a circuit panel and melting the solder balls in a conventional operation of the type commonly used for surface mounting of components to circuit boards.

As disclosed in U.S. Patent Publication Nos. 2005/0181544; 2005/0181655; and 2005/0173805, the disclosures of which are hereby incorporated by reference herein, as well as in U.S. Pat. No. 6,774,317, the disclosure of which is also incorporated by reference herein, a chip or other microelectronic element may be provided with terminals in the form of posts, and such posts may be bonded to a circuit panel in a similar soldering operation. In certain embodiments, the posts can provide particularly good engagement with test fixtures during testing before mounting to the circuit panel.

Semiconductor chip packages most commonly have been made by assembling individual chips with the other elements constituting the package. This requires handling and placement of the "bare" or unpackaged semiconductor chips. Various proposals have been advanced for making chip packages in a wafer-scale operation, as by uniting the wafer with the other elements of the packaged chip before severing the wafer to form individual chips. For example, the aforementioned '977 patent discloses certain embodiments of processes which form the chip packages in this manner.

Some processes for making packaged chips on a wafer scale have suffered from certain drawbacks. Where a compliant layer is formed on the front surface of a wafer, as, for example, by depositing a curable material and then curing the material to form the layer, the compliant layer tends to cause warpage of the wafer. Such warpage may occur, for example, due to differential expansion and contraction of the compliant material and the semiconductor material constituting the wafer during curing of the compliant material or during other processing operations. Such warpage makes it difficult to perform other processing operations such as forming the terminals and the connections between the terminals and the contacts. While such warpage can be reduced by reducing the thickness of the compliant layer, a thin compliant layer may not provide sufficient movability to the terminals.

As disclosed, for example, in U.S. Pat. No. 6,847,101, the disclosure of which is hereby incorporated by reference herein, a compliant layer may include individual elements in the form of protrusions projecting from the surface of the chip or wafer, with the terminals being disposed at the tops of such protrusions and with electrical connections between the terminals and the contacts including metallic strips extending downwardly from the tops of such protrusions towards the front surface of the chip or wafer. Such individual bumps or protrusions can provide significant compliance without the drawbacks associated with a continuous layer. However, the process for forming the terminals and connections is somewhat more demanding than the process for forming terminals and connections on a generally planar surface provided by a continuous compliant layer.

Proposals have been advanced for increasing the compliance of compliant layers or individual protrusions by forming the protrusions or layer with hollow cavities beneath the terminals. Such hollow cavities allow displacement of the terminals in the Z-direction toward the chip without the need to compress a solid body of compliant material disposed between the terminal and the chip surface. However, certain structures formed with such hollow cavities can be unreliable under some circumstances. Although the present invention is not limited by any theory of operation, it is believed that such reliability problems result at least in part from changes in the pressure of the gas trapped within such cavities.

Other designs have used compliant materials in the form of open-celled foams to provide substantial compressibility and thus facilitate Z-direction movement of the terminals. Forming compliant layers or protrusions from foam tends to create difficulties with contamination. Materials such as plating solutions or etchants used to form the terminals after deposition of the foam can infiltrate into the foam and attack the structure of the compliant layer or the chip itself during service.

Accordingly, despite the considerable effort in the art heretofore devoted to development of compliant packages and methods of forming the same, further improvements would be desirable.

SUMMARY OF THE INVENTION

One aspect of the present invention provides a semiconductor chip assembly, also referred to herein as a packaged chip. The semiconductor chip assembly according to this aspect of the invention desirably includes a chip having a front surface and having contacts exposed at the front surface, and also having one or more electrical elements within the chip electrically connected to the contacts. The assembly desirably further includes a compliant structure overlying a surface of the chip. The compliant structure preferably defines one or more cavities disposed between the top of the compliant layer and the chip. The assembly desirably includes one or more terminals carried by the compliant structure. At least some of the terminals are disposed adjacent at least one or more of the cavities as, for example, over the cavities, and at least some of the terminals are electrically connected to contacts on the chip. At least one of the chip and the compliant structure define one or more vents communicating with the cavities. The vents are open to outside of the assembly.

A further aspect of the invention provides an in-process structure. The in-process structure desirably includes a unitary wafer body having a front surface and including a plurality of chip-forming regions, each including electrical circuitry and contacts exposed at the front surface connected to such circuitry. The unitary body further includes saw lanes extending between the chip-forming regions. The in-process further includes a wafer compliant structure overlying the front surface of the body. The wafer compliant structure defines a top surface and a plurality of cavities disposed between the top surface and the front surface of the wafer body. The wafer compliant structure according to this aspect of the invention desirably also includes a plurality of channels communicating with the cavities and extending between the top surface and the front surface of the body, so that the channels extend away from the cavities. Most preferably, at least some of the channels extend across at least some of the saw lanes in the wafer body.

A further aspect of the invention provides methods of making chip assemblies. A method of making chip assemblies according to this aspect of the invention desirably includes the step of providing an in-process assembly including a semiconductor wafer, a wafer compliant structure overlying a front surface of the wafer, and cavities, as well as terminals carried on the compliant structure adjacent the cavities and electrically connected to the wafer, the cavities being substantially sealed. The method according to this aspect desirably further includes the step of subdividing the in-process assembly to form individual chip assemblies, each including one or more chip regions of the wafer, a portion of the compliant structure, and the terminals carried on such portion. The method desirably also includes the step of opening vents communicating with the cavities after the step of providing the in-process assembly. For example, where the in-process assembly has channels communicating with the cavities and the channels extend across saw lanes, the subdividing step may include severing the wafer and the compliant structure along the saw lanes so that the channels are open to form the vents at edges of each individual chip assembly during the severing step. Alternatively or additionally, the step of opening vents may include forming holes in the compliant structure. In a further alternative, the providing step may include providing holes in the wafer extending to a rear surface of the wafer and communicating with the cavities and also providing a dicing tape overlying the rear surface of the wafer, in which case the step of opening vents may include removing the dicing tape after the subdividing step.

DETAILED DESCRIPTION

Figure 1:
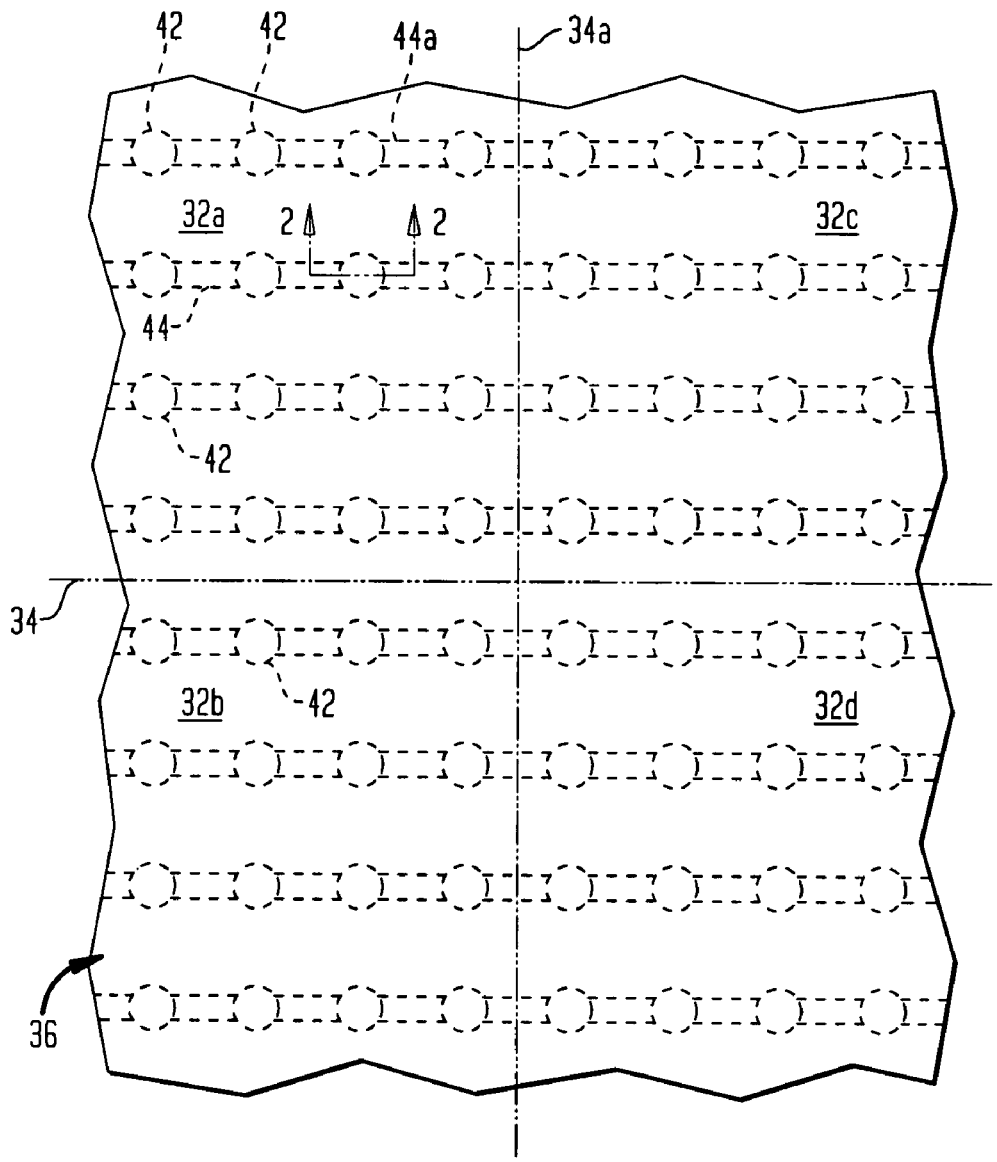
FIG. 1 is a fragmentary, diagrammatic plan view depicting a portion of an in-process unit according to one embodiment of the invention.

A portion of an in-process structure 20 according to one embodiment of the invention (FIG. 1) includes a wafer 22 having a unitary body formed from a semiconductor material, with or without other materials. Wafer body 22 has a front surface 24 and an oppositely-facing rear surface 26. The wafer may include a passivation layer 28 defining the front surface, the passivation layer being formed from a material which provides some resistance to chemical attack as, for example, a silicon oxide, silicon nitride, or polymer. The wafer also has numerous contacts 30 exposed at its front surface. As used in the present disclosure, a conductive feature such as a contact is referred to as "exposed at" a surface when such feature is accessible for engagement by a theoretical point moving towards the surface in a direction perpendicular to the surface. Thus, the contacts 30 may be flush with front surface 24 as depicted, may be recessed relative to the surface, or may project from the surface. The wafer includes numerous chip regions 32, each of which is adapted to form a single semiconductor chip. Thus, each region may include a large number of active electronic elements such as transistors, diodes, and other devices, and may also include passive components such as resistors, capacitors, and inductors. Four such regions are partially depicted in FIG. 1.

Regions 32 are separated from one another by saw lanes 34. The saw lanes bound each region and separate each region from adjacent regions. The saw lanes are long, linear portions of the wafer which do not include any structures required for operation of the chip in service. Thus, the saw lanes may be devoid of electronic components, or may include electronic components which are only used during testing of the wafer in its wafer state, before subdivision of the wafer into individual chips.

Figure 2:
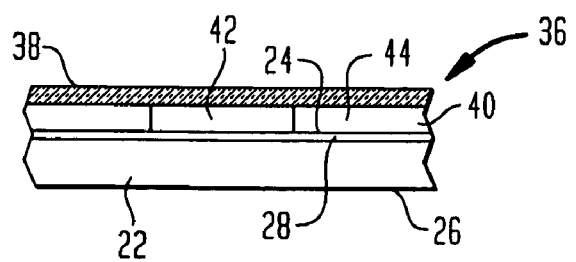
FIG. 2 is a fragmentary sectional view taken along line 2-2 in FIG. 1.

The in-process structure of FIGS. 1 and 2 also includes a compliant structure 36 which, in the embodiment of FIGS. 1 and 2, is a substantially continuous layer of a material having an elastic modulus lower than the elastic modulus of the semiconductor materials used in the wafer. For example, the compliant structure may be formed form organic polymers having elastic modulus below about 5 GPa at room temperature. Layer 36 defines a top surface 28 remote from the wafer and a bottom surface 40 facing downwardly toward the wafer. Terms such as "upwardly" and "downwardly" used in this disclosure should be understood as referring to the frame of reference of the wafer and chips formed from the wafer. Thus, the upward direction is the direction away from the wafer, whereas the downward direction is the direction toward the wafer, unless otherwise stated.

The compliant structure has numerous cavities 42 disposed below the top surface 38. In the particular embodiments depicted, the cavities are open to the bottom surface 40 of the compliant structure, and thus confront the top surface 24 of the wafer. The compliant structure also defines channels 44 (FIGS. 1 and 2) which are also disposed below the top surface 38 of the compliant structure. Thus, the compliant structure defines a layer which covers the channels 44 and cavities 42. The channels 44 communicate with the cavities 42 and extend across at least one saw lane bounding each chip region 32. For example, the channel 44a extending within chip region 32a also extends within chip region 32c and extends across the saw lane 34a demarcating the boundary between region 32a and 32c. In the in-process unit, layer 36 is continuous, and the top surface of layer 38 is substantially planar and unbroken. Thus, cavities 42 and channels 44 are substantially sealed between wafer 22 and layer 36.

In the particular embodiments depicted in FIGS. 1 and 2, the cavities 42 are depicted as circular and having diameters slightly larger than the breadth of channels 44. However, this is not essential. For example, the channels 44 may have a breadth equal to the diameter of the cavities, so that each channel 44 and the cavities communicating therewith form a continuous channel of uniform width.

The in-process structure including the compliant structure 36 and wafer 22 may be formed by molding the material constituting the compliant structure in a matched-metal mold such as a compression mold or injection mold having male parts corresponding to the desired cavities and channels so as to form layer 36 with the cavities and channels open to the bottom surface 40 of the layer, and then assembling the layer to the wafer. Alternatively, a preformed layer with the cavities and channels open to the bottom surface may be formed by casting, extruding or otherwise forming a sheet with smooth top and bottom surfaces and embossing the bottom surface. The material constituting the layer may be completely or partially cured during the forming process. Where the material is only partially cured, it may be further cured after assembly with the wafer, and may bond to the front surface 24 of the wafer during such further curing. Alternatively, a separate layer of adhesive (not shown) may be coated on the bottom surface of the layer or on the front surface of the wafer to bond the compliant structure to the wafer. Further processes for forming the compliant structure in place on the wafer surface are further described below.

Figure 3:
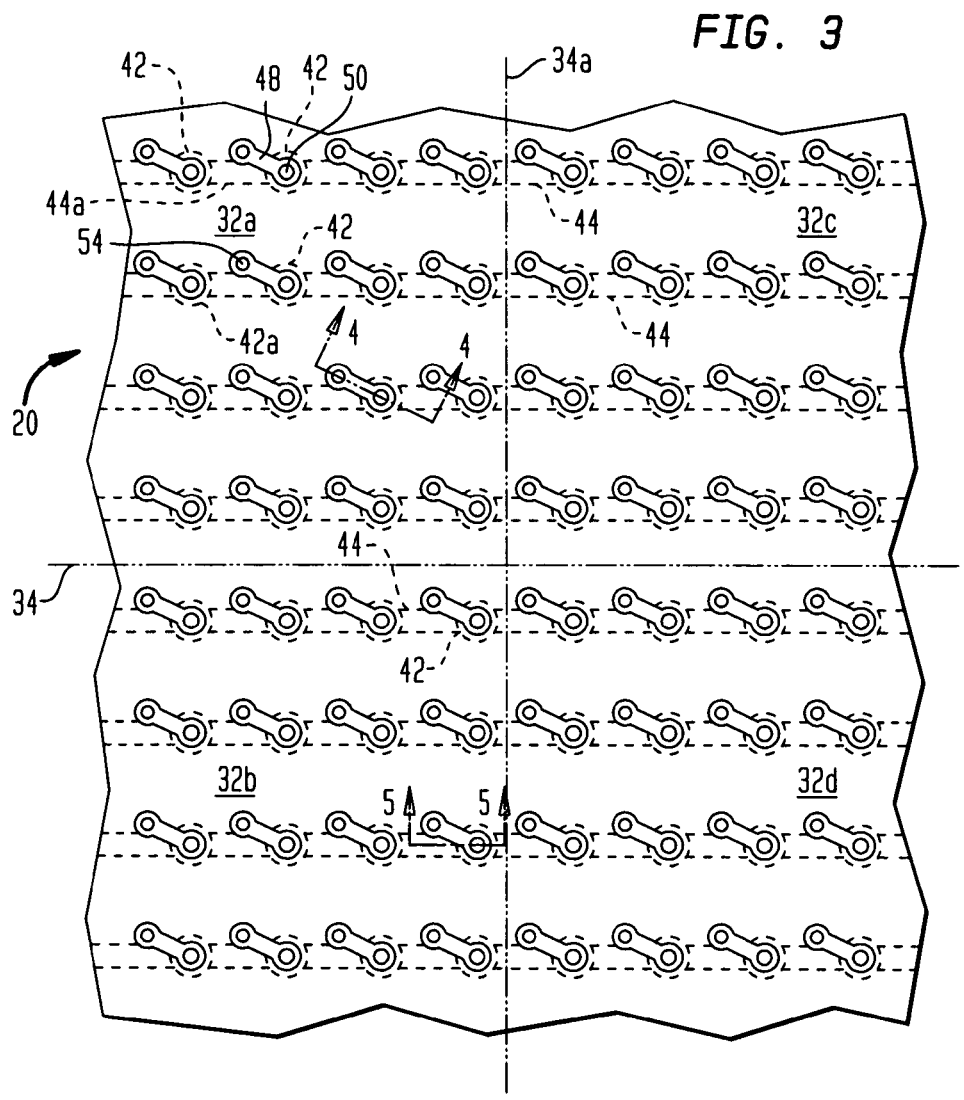
FIG. 3 is a view similar to FIG. 1, but depicting the in-process unit at a later stage in a process according to one embodiment of the invention.
Figure 4:
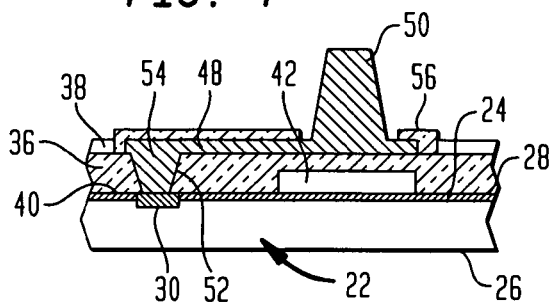
FIG. 4 is a fragmentary sectional view taken along line 4-4 in FIG. 3.

The in-process structure may be treated by forming traces 48 connected to contacts 30 of the wafer and terminals 50 (FIGS. 3 and 4) connected to the traces. As best seen in FIG. 4, the traces 48 may be formed on the top surface 38 of the compliant structure. In this embodiment, terminals 50 are in the form of posts projecting upwardly from the top surface 38 of the compliant structure. Traces 48 connect with terminals 30 at vias 52 extending through the compliant structure in alignment with the contacts. Each trace has a contact end 54 with a connection extending through a via 52 in the compliant structure 36, so that the contact end 54 is electrically connected to one of the contacts 30 of the wafer. The traces and terminals, and their connections to the contacts 30, may be formed using substantially conventional processes such as deposition and selecting etching of metallic layers. Vias 52 may be formed in the compliant structure before it is united with the wafer, or may be formed subsequently as by etching or laser ablating the compliant structure.

Posts or terminals 50 are aligned with cavities 42, so that each post lies over one of the cavities. The vias 52 which connect the traces 48 with the contacts do not pass through the channels or cavities. Extreme precision in placement of the cavities 42 and channels is not required; while each post or terminal 50 should overlie a cavity 42, it is not required that the axis of the post be precisely aligned with the center of the cavity.

The substantially planar top surface of the compliant structure 36 facilitates the processes used to form traces 48 and terminals 50. For example, a photoresist may be applied over a metallic layer during such processes and exposed to pattern-wise illumination to define areas to be removed or retained. The pattern-wise illumination may be readily focused on the photoresist layer, inasmuch as the photoresist layer may be substantially planar.

The materials such as plating solutions, etchants and the like used in forming the metallic structures do not enter into the cavities 42 or channels 44, because these structures remain sealed during these steps of the process.

A solder mask layer 56 (FIG. 4) may be formed over the traces with openings at the terminals 50. The solder mask layer may be formed, for example, by depositing a conventional photo imageable solder mask material over the top layer 38 and over traces 48, and then selectively exposing the photo imageable material to light, while leaving the portions of the material on terminals 50 uncured. After the selective curing step, the uncured material is removed as, for example, by washing the structure, leaving the terminals 50 uncovered. This step also is facilitated by the generally planar top surface 38. Here again, the cavities and channels remain sealed during this process step.

Figure 5:
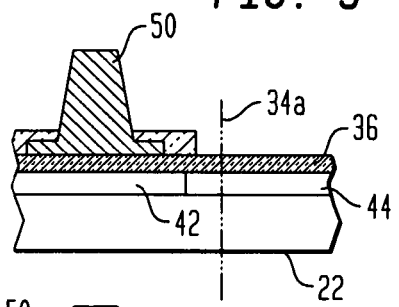
FIG. 5 is a fragmentary sectional view taken along line 5-5 in FIG. 3.
Figure 6:
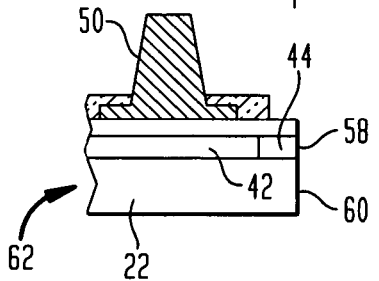
FIG. 6 is a view similar to FIG. 5, but depicting the unit at a later stage in the process.

Following formation of the metallic features, the wafer is severed by cutting it along the saw lanes 34. The severing operation cuts the compliant structure 36 and wafer 32 at planes corresponding to the saw lanes, thereby forming individual units or packaged chips, each having edges corresponding to the saw lanes, and each including one chip region 32 of the wafer. At those locations where channels 44 cross the saw lines 34, the severing operation opens vents communicating with cavities 42 through channels 44. For example, as best appreciated with reference to FIGS. 5 and 6, a vent 58 is formed at the juncture of channel 44 with an edge 60 of the unit formed by cutting along severance lane or saw lane 34. Thus, in the finished unit, the cavities 42 and channels 44 communicate with the exterior of the unit through vents 58.

Figure 7:
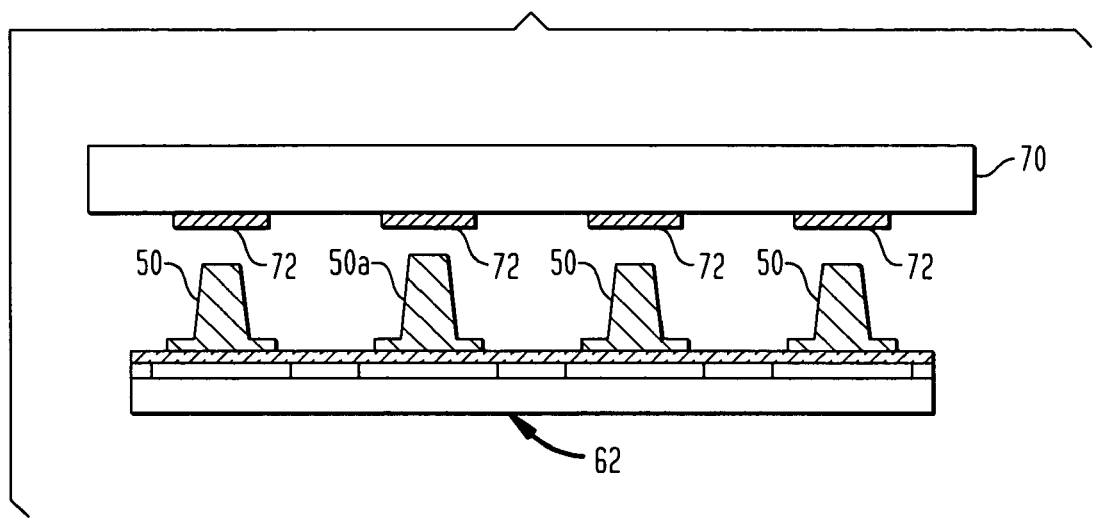
FIG. 7 is diagrammatic elevational view of a packaged chip made according to the process of FIGS. 1-6 in conjunction with test apparatus.
Figure 8:
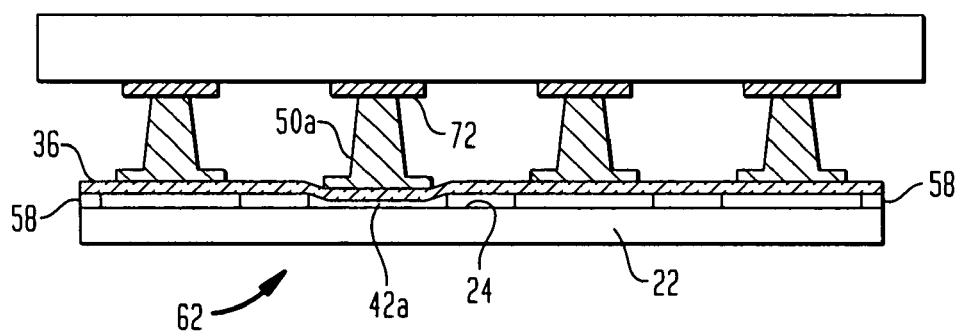
FIG. 8 is a view similar to FIG. 7, but depicting the packaged chip and test apparatus in a different condition.

Each unit or packaged chip 62 (FIGS. 7 and 8) may be handled and mounted in the same manner as other chip scale packages. For example, the posts 50 of each unit may be engaged with contact pads on a test fixture. As the tips of the posts are engaged with contact pads of the test fixture, the individual posts may move downwardly in the Z-direction towards the chip. This action is illustrated in FIGS. 7 and 8. As seen in FIG. 7, the packaged chip 62 has four terminals 50. Of these, terminal 50a projects slightly higher than the other terminals. The packaged chip is advanced toward a testing device 70 having contact pads 72. Terminal 50a is displaced downwardly, as seen in FIG. 8, as the tip of this terminal engages the mating contact pad 72. The compliant structure 36 deforms to facilitate this downward displacement. The portion of structure 36 overlying cavity 40a is displaced downwardly into the cavity, without the need to compress or deform a solid layer of material between the base of terminal 50a and the front surface 24 of the chip 22. Stated another way, because of the cavities 42 aligned with the terminals, the compliant structure has substantially greater compliance in the Z-direction, as measured at the terminals, than a comparable layer of solid material of the same composition having the same thickness. However, because cavities 42 are connected to vents 58 open to the exterior of the packaged chip 62, the gas pressure within cavities 42 will remain substantially equal to the prevailing atmospheric pressure outside of the packaged chip despite changes in temperature and ambient pressure, so that the packaged chip has high reliability.

In a process according to a further embodiment of the invention, a sacrificial material 102 (FIGS. 9 and 10) is applied onto the front surface 124 of a wafer 122 in a pattern corresponding to the pattern of the desired cavities and channels. The sacrificial material may be a photo imageable material which can be applied as a continuous layer and then selectively degraded or selectively cured by application of light or other radiant energy. Alternatively, the sacrificial material may be applied by a molding process in which a mold having a cavity corresponding to the desired shape of the sacrificial material is applied onto the front surface of the wafer and filled with the sacrificial material, which then solidifies in place within the mold, whereupon the mold is removed.

In a further alternative, the sacrificial material may be applied by applying a photo imageable mask material onto the front surface of the wafer and then patterning the mask by selectively exposing the mask to radiant energy and removing portions of the mask, leaving the areas to be covered by the sacrificial material open, but leaving the mask material on other areas. After selective removal of the masking material, the sacrificial material is deposited over the mask and solidified, whereupon the mask is removed, leaving the sacrificial material only in the open areas. Any other process capable of forming the desired pattern of sacrificial material can be used.

The sacrificial material itself may be essentially any material compatible with the subsequent manufacturing steps discussed below. Depending on the composition of the materials used to form the compliant structure, the sacrificial material may include polymeric materials, low-melting metals, and other materials which can be melted or vaporized, as discussed below. Where the compliant structure is formed from a material which can cure in the presence of water, water may be used as the sacrificial material; after deposition, it is frozen in the desired form.

Figure 9:
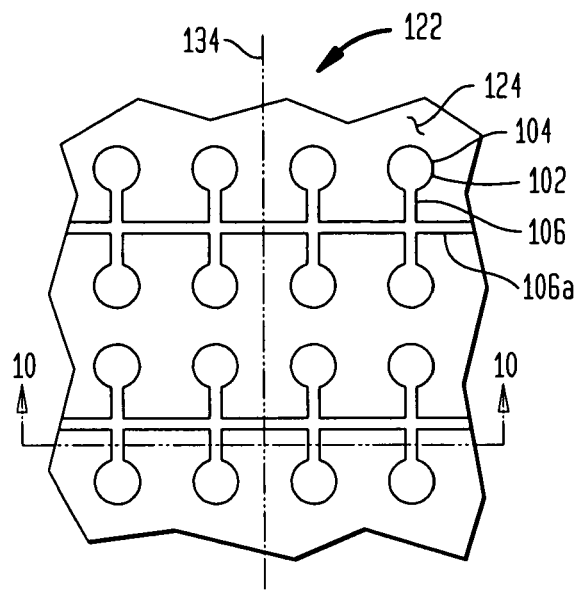
FIG. 9 is a fragmentary plan view of a wafer during one stage of a process in accordance with a further embodiment of the invention.
Figure 10:
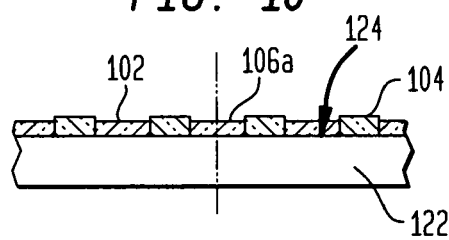
FIG. 10 is a fragmentary sectional view taken along line 10-10 in FIG. 9.

The particular pattern of the sacrificial material depicted in FIG. 9 includes masses of sacrificial material 104 corresponding to the cavities to be formed and elongated strips of sacrificial material 106 corresponding to the channels. The strips are arranged so that each mass 104 of cavity-forming material is directly or indirectly connected to a strip, such as strip 106a in FIG. 9, which extends across a saw lane 134 of the wafer. The particular pattern of masses and channels will form a rather complex pattern of interconnected cavities and channels, but this pattern is merely illustrative. For example, the strips 106 may be the same width as masses 104.

Figure 11:
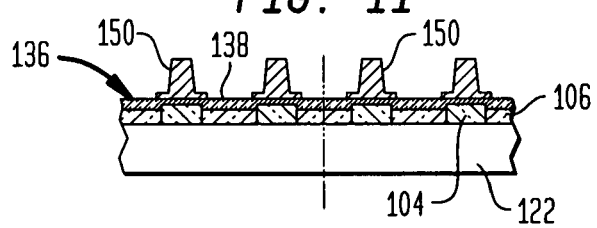
FIG. 11 is a view similar to FIG. 10, but depicting an in-process unit made from the wafer at a later stage in the process.

After deposition and solidification of the sacrificial material, a compliant structure 136 (FIG. 11) is formed by depositing a curable material over the sacrificial material and then curing the material to a solid form or to a substantially solid form, such as a gel or elastomer.

The top surface 138 of the compliant structure may be formed as a substantially planar surface where the curable material 136 is deposited to a substantially uniform height. Alternatively, as discussed further below, the compliant structure 136 may be formed as one or more isolated bumps or islands covering the sacrificial material.

Figure 12:
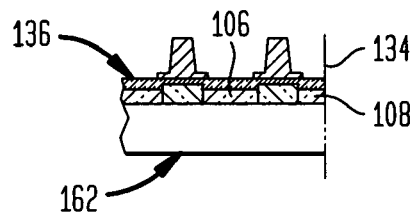
FIGS. 12 and 13 are views similar to FIG. 11, but depicting the unit at still later stages of the process.
Figure 13:
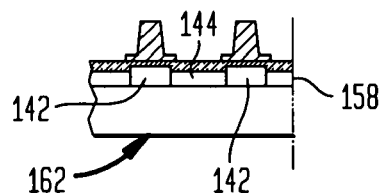

Following formation of the compliant structure, the conductive elements such as terminals 150 are formed on the compliant structure in substantially the same way as discussed above. Following formation of the terminals and other conductive features and connection of these features to the contacts (not shown) of the wafer, the wafer and the overlying sacrificial material and compliant structure are severed along the saw lanes. As shown in FIG. 12, this cuts the wafer, sacrificial material, and compliant structure into individual units, each including one chip region of the wafer and the overlying portions of the compliant structure and the terminals associated therewith, and also including the sacrificial material. The severing operation opens vent interfaces 108 at the edges of the units, at those locations where the strips of sacrificial material 106 cross the saw lanes 134.

After the severing operation, the units are treated to remove the sacrificial material through the vent interfaces. For example, where the sacrificial material is a material which can be melted at a reasonable temperature, the units may be heated as a whole to melt the sacrificial material and allow the sacrificial material to drain through the vent interfaces. Preferably, the sacrificial material is converted to a vapor and the vapor formed from the sacrificial material passes out through the vent interfaces. For example, water used as a sacrificial material can be removed by heating the unit so as to convert the water to steam. In other instances, the sacrificial material may be converted to a liquid or to a vapor by chemical decomposition. Such chemical decomposition may be induced, for example, by applying radiant energy such as ultraviolet light to the sacrificial material. Desirably, the compliant structure 136 is formed from a material transmissive to such radiant energy. Alternatively or additionally, chemical decomposition of the sacrificial material may be induced by passage of time. That is, the sacrificial material may be a material which will solidify and remain solid for a period of time long enough to accomplish formation of the compliant structure 136, but which will subsequently decompose to form a liquid or vapor. Polymers capable of controlled degradation with time are known.

Following removal of the sacrificial material, each unit has cavities 142 and channels 144 connecting the cavities to vent openings 158 and operates in substantially the same manner as discussed above.

In a method according to a further embodiment of the invention, the compliant structures 236 formed on the front surface of a wafer are small, isolated structures rather than a continuous layer. Each structure includes terminals 250 connected to some of the contacts on the chip. The individual compliant structures may be formed in substantially the same ways as discussed above. In this structure, the cavities 242 and channels 244 are provided as small units, each such unit including a cavity lying on one side of a saw lane 232, a cavity lying on the opposite side of the same saw lane, and a channel extending across the saw lane. Here again, the channel 244 may be of substantially the same width as the cavities, so that each such unit is in the form of a generally oval, unitary void extending across the saw lane. Here again, when the wafer is severed to form individual units, each including one chip region 232 and the associated portions of the compliant structures, vents are opened at the locations where each individual unit crosses the saw lane, so that in the finished structure, each cavity communicates with at least one such vent.

In a method according to a further embodiment of the invention, a compliant structure 336 overlying all or a portion of a wafer includes numerous units, each including at least one cavity 342 and one or more passages or channels 344 extending horizontally from the cavity. In the particular embodiment shown, each unit includes two cavities and a channel 344 having width equal to the diameters of the cavities, so that each unit forms a horizontally elongated void. Here again, terminals 350 are formed over the compliant structure, along with other electrically conductive features such as traces 348 and via liners 354 connecting the traces to contacts on the wafer. In this instance, however, the units do not extend across the saw lanes. Here again, the cavities and channels are sealed by the wafer and by the overlying compliant structure 336 during the processes involved in forming the metallic features on the compliant structure.

Figure 15:
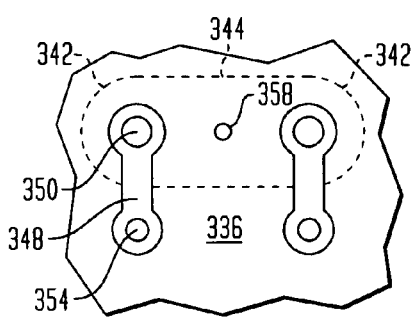
FIG. 15 is a fragmentary plan view of an in-process unit according to a still further embodiment of the invention.

After these processes have been completed or substantially completed, each unit including one or more cavities and channels is opened to the exterior of the structure by forming a vent hole 358 extending through the compliant structure from its top surface, i.e., the surface visible in FIG. 15. In this instance, the wafer may be severed to form individual units before or after formation of the metallic structures on the compliant structure. Also, the vents may be formed before or after severing the wafer to form individual units. The vent holes 358 may be formed, for example, by laser ablation or etching of the compliant structure. There is no particular need for precision in placement of the vent holes, provided that each unit communicates with at least one such vent hole.

In a process according to a further embodiment of the invention, the wafer 422 (FIG. 16) is provided with vent bores 401 extending through the wafer from its front surface 424 to its rear surfaces 426. There is at least one vent bore 401 within each chip-forming region of the wafer. One or more compliant structures 436 are formed on the front surface 424 of the wafer. Each compliant structure includes one or more cavities 442, and each such cavity communicates with at least one vent bore. In the particular embodiment depicted in FIG. 16, each compliant structure is an isolated protrusion including only a single cavity, and that single cavity communicates directly with a vent bore.

Figure 14:
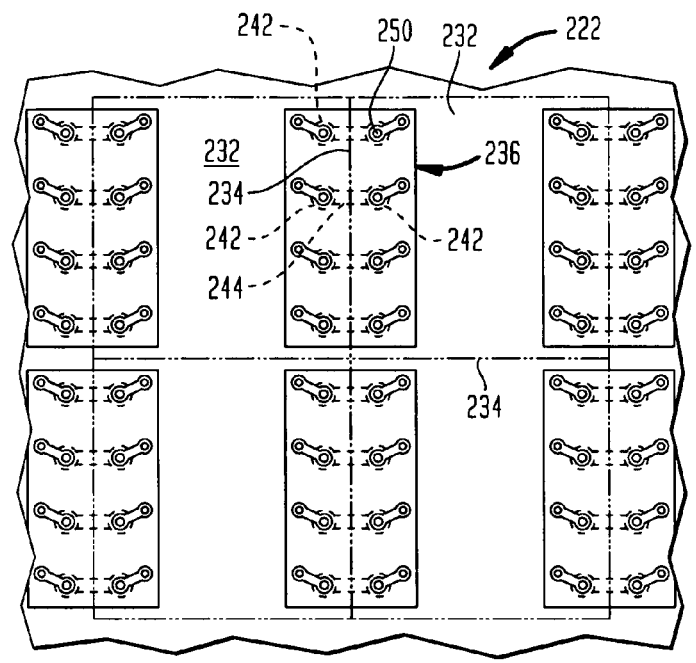
FIG. 14 is a fragmentary plan view of an in-process unit according to yet another embodiment of the invention.

In other embodiments, each compliant structure may include numerous cavities connected to one another by channels, and each such connected group of cavities is in communication with at least one vent bore 401. For example, the compliant structure may be formed as a unitary layer covering the entirety of the front surface, as discussed with reference to FIGS. 1-6, or as a set of individual units, as discussed above with respect to FIG. 14.

Either before or after formation of the compliant structures, a dicing tape 403 is applied over the rear surface 426 of the wafer, so that the dicing tape occludes the vent bores 401. Typically, prior to severing a wafer into individual chips, a dicing tape is applied to the rear surface of the wafer so as to hold the chips in place after the dicing saw cuts through the wafer along the severance planes or saw lanes 434. Thus, the requirement to apply a dicing tape in this embodiment does not impose any appreciable additional cost or require any additional operations. After application of the dicing tape, metallic features such as terminals 450 and traces 448 are formed at least partially on the compliant structures. In the particular embodiment illustrated, each compliant structure carries one terminal 450, and the traces 448 extend along the downwardly sloping sides of the compliant structure to the contacts 430 of the wafer. The metallic structures may be formed before or after the wafer is severed into individual units. After formation of the metallic structures and after severance of the wafer, the dicing tape 403 is removed leaving individual units 462. Removal of the dicing tape opens the vent bores 401, leaving each cavity 442 connected to a vent 458 remote from the cavity and open to the exterior of the unit or packaged chip 462.

Figure 16:
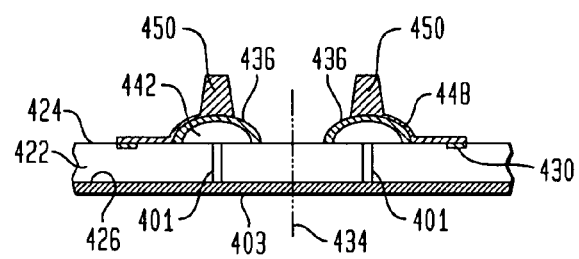
FIG. 16 is a fragmentary sectional view depicting a portion of an in-process assembly according to yet another embodiment of the invention.
Figure 17:
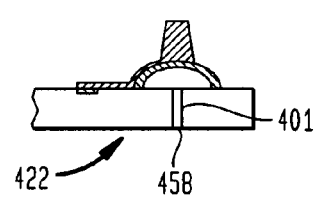
FIG. 17 is a view similar to FIG. 16, but depicting a portion of the unit at a still later stage of the process.

A method employing a wafer with vent bores such as discussed with reference to FIGS. 16 and 17 may employ a sacrificial material as discussed with reference to FIGS. 9-13. In such a method, the sacrificial material is removed by expelling it through the vent bores after removal of the dicing tape or other structure occluding the vent bores at the rear surface.

Numerous variations and combinations of the features discussed above can be utilized without departing from the present invention. For example, in the embodiments discussed above, each of the terminals is in the form of a post. However, all of the embodiments discussed above can be formed with terminals of other types as, for example, flat terminals suitable for application of a solder ball or other bonding material. Also, in each of the embodiments above, the cavities and channels in the finished units are devoid of any solid material, and hence are occupied only by gas at ambient pressure.

In a further variant, the cavities and channels in the finished may be filled with an open-celled foam or other porous, compressible material. In one variant, the open-celled porous material may be used in place of the sacrificial material discussed above with reference to FIGS. 9-13. The open-celled porous foam may be selected to have a relatively small pore size, and may be non-wettable by the material used to form the compliant structure. Thus, when the material used to form the compliant structure is applied over the foam, the foam remains open-celled and porous; the material of the compliant structure does not substantially penetrate into the foam and does not substantially fill the foam. In such an embodiment, the foam remains in place in the cavities and channels and is not removed. In other embodiments, the cavities and channels are formed and then subsequently filled with a formable material which is adapted to form an open-celled, porous and compressible foam.

Figure 18:
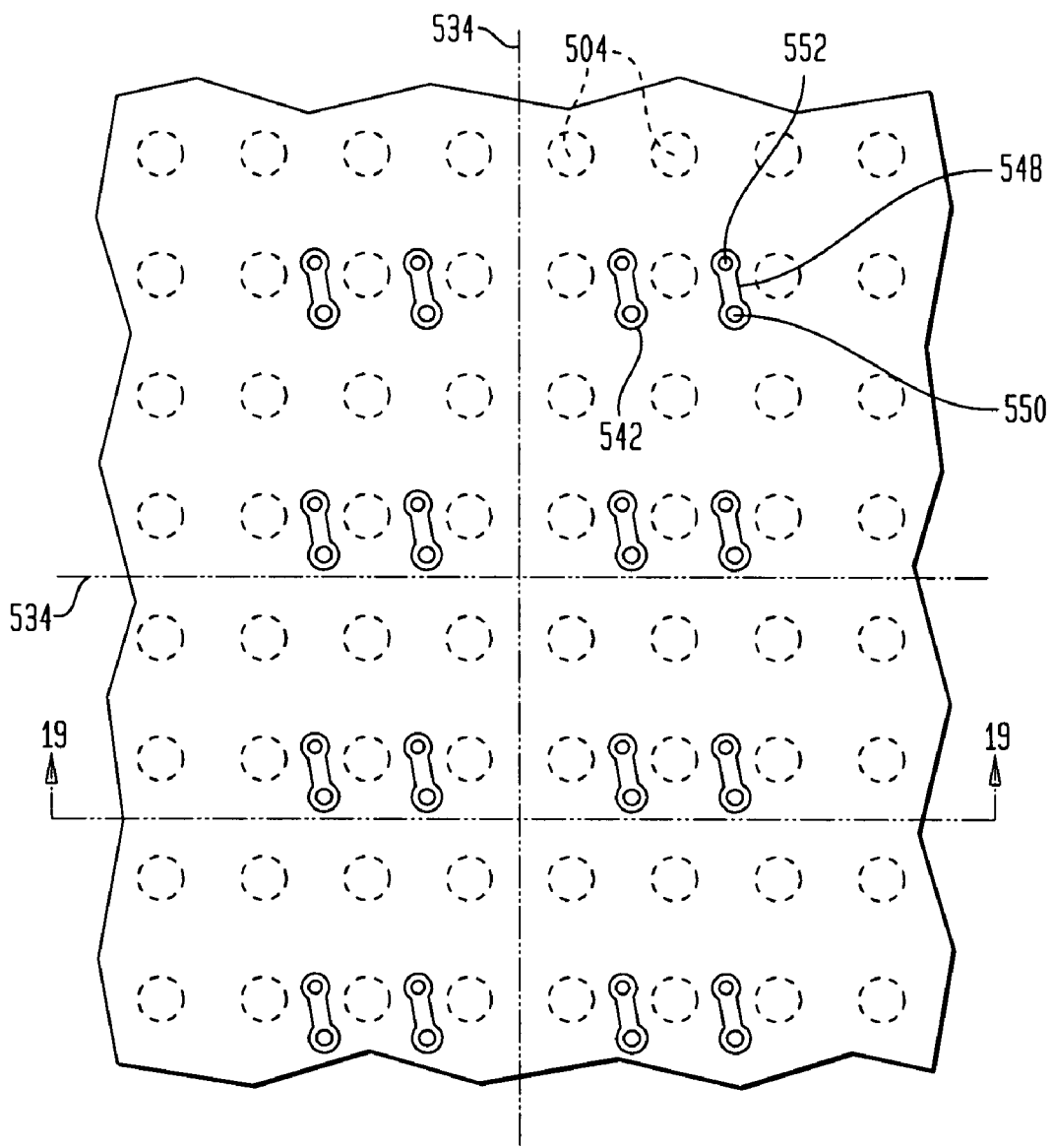
FIG. 18 is a fragmentary plan view of an in-process unit according to yet another embodiment of the invention.
Figure 19:
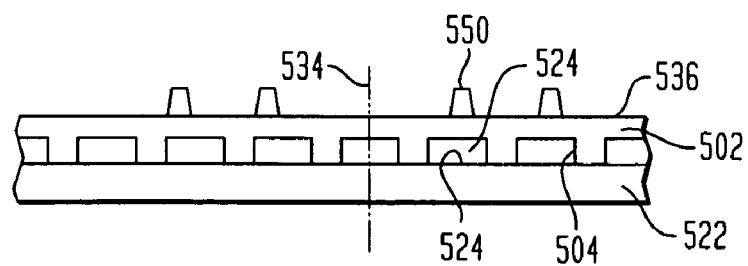
FIG. 19 is a fragmentary sectional view along line 19-19 in FIG. 18.

In an in-process structure according to a further embodiment of the invention (FIGS. 18 and 19), the compliant structure 536 is in the form of a sheet 502 having numerous spaced-apart support structure 504 projecting downwardly from the sheet to the top surface 524 of the wafer 522. The porous structure thus defines numerous cavities interconnected with one another and forming a continuous set of passages extending over substantially all of the surface area of the sheet, except for that surface area occupied by the posts or support elements. Here again, the cavities 542 are substantially sealed between the sheet 502 and wafer 522, so that once again, conductive elements such as terminals 550 and traces 548 (FIG. 18), as well as connections 552 interconnecting the traces with the contacts of the wafer, can be formed without contamination of the cavities. In the same manner as discussed above, when the wafer and compliant structure are severed along the saw lanes or severance planes 534, the set of vents are opened at the severance planes, where the interconnected cavities cross the severance planes. Thus, after severance, the cavities in this embodiment as well are connected to vents which are open to the exterior of the packaged chips.

In still further embodiments, the elements supporting sheet 502 above the top surface or front surface 524 of wafer 522 are conductive support elements, rather than portions of the compliant structure. For example, the conductive support elements may be prepositioned on the contacts of the wafer, and the sheet 502 may be disposed over these conductive support elements. The traces or other conductive elements formed on the sheet are electrically connected to the conductive support elements and thus connected to the contacts of the wafer.

As these and other variations and combinations of the features discussed above may be utilized without departing from the present invention, the foregoing description of the preferred embodiments should be taken by way of illustration rather than by limitation of the invention as defined by the claims.

The invention claimed is:

1. A semiconductor chip assembly including:
   (a) a chip having a front surface and having contacts exposed at said front surface, and one or more electrical elements within the chip electrically connected to said contacts;
   (b) a compliant structure overlying a surface of the chip, said compliant structure defining a layer having a top surface facing away from the chip and one or more cavities disposed between said layer and the chip body and one or more channels between said layer and the chip body, said channels extending in a lateral direction along said surface of said chip;
   (c) terminals carried by said compliant structure, at least some of said terminals being disposed adjacent said one or more cavities, at least some of said terminals being electrically connected to said contacts of said chip,
   said compliant structure defining one or more vents communicating with said one or more cavities through said one or more laterally extending channels, said one or more vents being open to outside of the assembly.

2. The assembly as claimed in claim 1 wherein said compliant structure overlies the front surface of the chip.

3. The assembly as claimed in claim 2 wherein said top surface of said compliant structure is substantially planar, and said terminals are exposed at said top surface.

4. The assembly as claimed in claim 3 further comprising electrically conductive traces extending along said top surface, at least some of said terminals being electrically connected to said contacts by said traces.

5. The assembly as claimed in claim 2 wherein said chip has edges bounding said front surface, said compliant structure extends to at least one of said edges, and at least one of said vents is disposed at at least one of said edges.

6. The assembly as claimed in claim 5 wherein said compliant structure defines channels extending horizontally between at least some of said cavities and at least some of said vents.

7. The assembly as claimed in claim 1 wherein said one or more cavities include a plurality of cavities and said terminals include a plurality of terminals, at least some of said terminals being aligned with at least some of said cavities.

8. The assembly as claimed in claim 7 wherein said aligned terminals and cavities include individual terminal and cavity units, each such individual terminal and cavity unit including a single one of said terminals aligned with a single one of said cavities.

9. The assembly as claimed in claim 1 wherein said terminals include elongated posts projecting from said compliant structure.

10. An in-process structure including:
    (a) a unitary wafer body having a front surface, said unitary body including a plurality of chip-forming regions each including electrical circuitry and contacts exposed at said front surface electrically connected to said electrical circuitry, said unitary body further including saw lanes extending between said chip-forming regions; and
    (b) a wafer compliant structure overlying said front surface of said body, said wafer compliant structure defines a top surface, a plurality of cavities disposed between said top layer and the front surface, and a plurality of channels communicating with said cavities and extending between said top layer and said front surface,
    wherein at least some of said channels extend across at least some of said saw lanes.

11. A semiconductor chip assembly including:
    (a) a chip having a front surface and having contacts exposed at said front surface, and one or more electrical elements within the chip electrically connected to said contacts;
    (b) a compliant structure overlying the front surface of the chip, said compliant structure defining a top surface facing away from the chip and one or more cavities disposed between said top surface and the chip body;
    (c) terminals carried by said compliant structure, at least some of said terminals being disposed adjacent said one or more cavities, at least some of said terminals being electrically connected to said contacts of said chip,
    at least one of said chip and said compliant structure defining one or more vents communicating with said one or more cavities, wherein said one or more vents are open to outside of the assembly, at least some of said vents are remote from said cavities, and at least some of said vents extend through said chip.

12. A semiconductor chip assembly as claimed in claim 11, wherein all of said vents are remote from said cavities.

* * * * *